United States Patent
Matsui

(10) Patent No.: US 8,044,489 B2
(45) Date of Patent: Oct. 25, 2011

(54) SEMICONDUCTOR DEVICE WITH FLUORINE-CONTAINING INTERLAYER DIELECTRIC FILM TO PREVENT CHALCOGENIDE MATERIAL LAYER FROM EXFOLIATING FROM THE INTERLAYER DIELECTRIC FILM AND PROCESS FOR PRODUCING THE SAME

(75) Inventor: Yuichi Matsui, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 280 days.

(21) Appl. No.: 12/279,916

(22) PCT Filed: Feb. 28, 2006

(86) PCT No.: PCT/JP2006/303733
§ 371 (c)(1),
(2), (4) Date: Aug. 19, 2008

(87) PCT Pub. No.: WO2007/099595
PCT Pub. Date: Sep. 7, 2007

(65) Prior Publication Data
US 2009/0050871 A1    Feb. 26, 2009

(51) Int. Cl.
*H01L 23/52* (2006.01)

(52) U.S. Cl. ........ 257/529; 257/209; 257/296; 257/298; 257/903; 257/E21.661; 257/E21.662; 257/E21.68; 257/E27.098; 365/148; 365/163; 365/182

(58) Field of Classification Search ................. 257/209, 257/529, E31.029, 296, 298, 903, E21.661, 257/E21.662, E21.68, E27.098; 365/163, 365/148, 182
See application file for complete search history.

(56) References Cited

U.S. PATENT DOCUMENTS

| | | | | |
|---|---|---|---|---|
| 6,057,242 A | * | 5/2000 | Kishimoto | 438/692 |
| 7,471,555 B2 | * | 12/2008 | Lung | 365/163 |
| 2003/0047727 A1 | | 3/2003 | Chiang | |
| 2003/0156468 A1 | * | 8/2003 | Campbell et al. | 365/200 |
| 2004/0026731 A1 | | 2/2004 | Fournier et al. | |
| 2005/0226062 A1 | | 10/2005 | Aratani et al. | |
| 2006/0163554 A1 | | 7/2006 | Lankhorst et al. | |

FOREIGN PATENT DOCUMENTS

| | | |
|---|---|---|
| EP | 1318552 | 6/2003 |
| JP | 2004-241535 | 8/2004 |

OTHER PUBLICATIONS

Friedrich et al, "Structural Transformations of $GE_2Sb_2Te_5$ Films Studied by Electrical Resistance Measurements", Journal of Applied Physics, vol. 87, Issue 9, May 2000, p. 4130.

Stefan Lai et al, "OUM-A 180 nm Nonvolatile Memory Cell Element Technology for Stand Alone and Embedded Applications", Technical Digest of International Electron Device Meeting, 2001, p. 803-806.

* cited by examiner

*Primary Examiner* — Jay C Kim
(74) *Attorney, Agent, or Firm* — Mattingly & Malur, P.C.

(57) ABSTRACT

A semiconductor device having a phase-change memory cell comprises an interlayer dielectric film formed of, for example, SiOF formed on a select transistor formed on a main surface of a semiconductor substrate, a chalcogenide material layer formed of, for example, GeSbTe extending on the interlayer dielectric film, and a top electrode formed on the chalcogenide material layer. A fluorine concentration in an interface between the interlayer dielectric film and the chalcogenide material layer is higher than a fluorine concentration in an interface between the chalcogenide material layer and the top electrode.

17 Claims, 8 Drawing Sheets

US 8,044,489 B2

SEMICONDUCTOR DEVICE WITH FLUORINE-CONTAINING INTERLAYER DIELECTRIC FILM TO PREVENT CHALCOGENIDE MATERIAL LAYER FROM EXFOLIATING FROM THE INTERLAYER DIELECTRIC FILM AND PROCESS FOR PRODUCING THE SAME

TECHNICAL FIELD

The present invention relates to semiconductor devices and a technique of manufacturing the same, and more particularly, it relates to a technique effectively applied to a semiconductor device having a phase-change memory formed by using a phase-change material such as chalcogenide.

BACKGROUND ART

In mobile devices represented by mobile phones, semiconductor memories such as DRAM, SRAM, and FLASH memory are used. Each of the memories has advantages and disadvantages, and currently, they are subjected to use depending on the characteristics thereof.

For example, while DRAM has a large capacity, the access speed thereof is low. On the other hand, while the speed of SRAM is high, since many transistors as much as 4 to 6 transistors are required per one cell, it is difficult to increase the degree of integration, and it is not suitable for a large-capacity memory.

Moreover, DRAM and SRAM always require power supply to retain data (volatile). On the other hand, while FLASH memory does not require power supply for electrical memory retention since it is non-volatile, it has disadvantages that the number of times of rewrite or erase is limited to about $10^5$ times and that the rewriting speed is slower than other memories by several digits.

If a universal memory having advantages of the DRAM, SRAM, and FLASH memory in combination can be realized, a plurality of memories can be integrated in one chip, and downsizing and function enhancement of mobile phones or various mobile devices can be achieved. Furthermore, if all semiconductor memories can be replaced, the impact is significantly large. Factors required for the universal memory include, for example, increasing the degree of integration (increasing capacity) to the level of DRAM, high-speed access (write/read) to the level of SRAM, non-volatility like FLASH memory, and low-power consumption that can withstand small battery drive, etc.

Among next-generation non-volatile memories called universal memories, what is currently attracting attention the most is a phase-change memory. The phase-change memory uses a chalcogenide material that is used in optical disks such as CD-RW and DVD and similarly stores data by the difference between a crystalline state and an amorphous state. The difference between the phase-change memory and the optical disk resides in the writing/reading method. The optical disk utilizes transmission and reflection of light typified by laser; on the other hand, in the phase-change memory, write is performed by Joule heat generated by a current, and a signal is read by the difference of resistance values caused by phase change.

Regarding a phase-change memory cell, there is a description in Technical Digest of International Electron Device Meeting, 2001, p. 803-806 (Non-Patent Document 1). Regarding the phase change of chalcogenide materials, there is a description in Journal of Applied Physics, Volume 87, Issue 9, May 2000, p. 4130 (Non-Patent Document 2).

Moreover, Japanese Patent Application Laid-Open Publication No. 2003-174144 (Patent Document 1), U.S. Patent Application Publication No. US 2004/0026731 (Patent Document 2), and U.S. Patent Application Publication No. US 2003/0047727 (Patent Document 3) describe techniques for inserting an adhesive layer between an electrode and a chalcogenide material layer for preventing exfoliation between the electrode and the chalcogenide material layer in a phase-change memory.

In addition, as a result of prior art document research carried out by the inventor of the present invention, Japanese Patent Application Laid-Open Publication No. 2004-288843 (Patent Document 4) describes a structure in which a stacked film comprising an amorphous thin film containing chalcogenide and a top electrode is formed so that the stacked film is connected to a bottom electrode via an opening formed in an insulating film on the bottom electrode formed on a silicon substrate.

Patent Document 1: Japanese Patent Application Laid-Open Publication No. 2003-174144
Patent Document 2: U.S. Patent Application Publication No. US 2004/0026731
Patent Document 3: U.S. Patent Application Publication No. US 2003/0047727
Patent Document 4: Japanese Patent Application Laid-Open Publication No. 2004-288843
Non-Patent Document 1: Technical Digest of International Electron Device Meeting, 2001, p. 803-806
Non-Patent Document 2: Journal of Applied Physics, Volume 87, Issue 9, May 2000, p. 4130

DISCLOSURE OF THE INVENTION

The inventor of the present invention has studied semiconductor devices having phase-change memories formed by using chalcogenide materials, and as a result, the following points have been elucidated. Specifically, the inventor of the present invention has found out that there is a problematic point that, since a chalcogenide material has low adhesiveness, it is readily exfoliated from an interlayer dielectric film formed of a silicon oxide film formed on a semiconductor substrate in a manufacturing process of a phase-change memory.

Hereinafter, the semiconductor devices having the phase-change memory cells studied by the inventor of the present invention will be described with reference to FIG. 7 to FIG. 11. FIG. 7 to FIG. 9 are cross sectional views of main parts schematically showing an example of the semiconductor devices in manufacturing steps studied by the inventor of the present invention, and FIG. 10 and FIG. 11 are cross sectional views of main parts schematically showing examples of the semiconductor devices studied by the inventor of the present invention. Note that, in FIG. 7 to FIG. 11, phase change memories are shown as a main part of the semiconductor devices.

An example of a manufacturing process of a phase-change memory cell will be briefly described with reference to FIG. 7 to FIG. 9. As shown in FIG. 7, after a select transistor comprising, for example, a MOS transistor and a bipolar transistor is formed by a known manufacturing method on a semiconductor substrate not shown, an interlayer dielectric film 1 formed of, for example, a silicon oxide film is deposited on the select transistor by a known manufacturing method. Then, a plug 2 formed of, for example, tungsten is formed in the interlayer dielectric film 1. This plug functions to electrically connect the select transistor below and a chalcogenide material layer (phase-change material layer) above to each other. Next, a chalcogenide material layer 3 formed of, for example, GeSbTe, a top electrode 4 formed of, for example, tungsten, and a hard mask 5 formed of, for example, a silicon oxide film are sequentially deposited.

Subsequently, as shown in FIG. 8, the hard mask 5, the top electrode 4, and the chalcogenide material layer 3 are sequentially processed by a known lithography method and dry etching method.

Subsequently, as shown in FIG. 9, an interlayer dielectric film 6 is deposited so as to cover the processed hard mask 5, top electrode 4, and chalcogenide material layer 3. Then, a wiring layer which is electrically connected to the top electrode 4 is formed above the interlayer dielectric film 6, and a plurality of wiring layers are further formed thereabove (not shown). The phase-change memory cell is substantially completed by the above steps.

Meanwhile, in the structure of such a phase-change memory cell, the adhesiveness of the chalcogenide material layer 3 is low; therefore, there arises the problem that exfoliation from the interlayer dielectric film 1 formed of a silicon oxide film formed on the semiconductor substrate in the manufacturing process of the phase-change memory readily occurs.

Accordingly, the inventor of the present invention has carried out a study for preventing exfoliation of the chalcogenide material layer from the interlayer dielectric film formed of a silicon oxide film formed on the semiconductor substrate in the manufacturing process of the phase-change memory. Herein, the interlayer dielectric film uses a silicon oxide film formed by a chemical vapor deposition method (CVD method), for example, a so-called P-TEOS film formed by a plasma CVD method using tetraethoxysilane ($Si(OC_2H_5)_4$): TEOS) and oxygen as its raw materials is used.

The phase-change memory shown in FIG. 10 is formed on a main surface of a semiconductor substrate (not shown) and has a structure in which an adhesive layer 7 formed of a conductive material such as Ti is formed on a plug 2 and an interlayer dielectric film 1, and a chalcogenide material layer 3 is formed on the adhesive layer 7. Since the adhesive layer 7 is provided on the entire surface of the interface between the chalcogenide material layer 3 and the interlayer dielectric film 1 in this manner, exfoliation of the chalcogenide material layer 3 can be prevented. However, in this structure, when a voltage is applied from the plug 2 in a rewrite operation of the phase-change memory, a current mainly flows in the lateral direction of the adhesive layer 7 (direction parallel to the substrate surface) since the adhesive layer 7 has a lower resistivity than the chalcogenide material layer 3. In this case, the region of the chalcogenide material layer that is heated by Joule heat is expanded to the entire surface of the part that is in contact with the adhesive layer 7; therefore, there arises a problem that an extremely large current is required for crystallization or amorphization of the chalcogenide material layer.

The above-mentioned problem can be solved by forming the adhesive layer 7 formed of a conductive material only in a region that is not in contact with the plug 2 as shown in FIG. 11. In this case, the region of the chalcogenide material layer 3 that is heated by Joule heat is limited to a part that is in contact with the plug 2; therefore, the current required for crystallization or amorphization of the chalcogenide material layer 3 is reduced compared with the case of FIG. 10. However, since the region in which the adhesive layer is not provided exists at the interface between the chalcogenide material layer 3 and the interlayer dielectric film 1, the exfoliation of the chalcogenide material layer cannot be completely prevented. Moreover, after the conductive material is formed on the entire surface of the substrate including the interlayer dielectric film 1 and the plug 2, a step of removing the conductive material except for that of the adhesive layer 7 on the plug 2 is additionally required. In this case, there arise problems that the number of masks is increased, thereby increasing the manufacturing cost and that the alignment margin is reduced when memory cells are miniaturized, thereby reducing yield and reliability.

In the above-described Patent Documents 1 to 4 and Non-Patent Documents 1 to 2, there are not described techniques for solving these problems of increase of current for crystallization or amorphization of the chalcogenide material layer, increase of the manufacturing cost, and reduction of yield and reliability; and thus a technique capable of preventing exfoliation of the chalcogenide material layer without adversely affecting the rewrite property of the phase-change memory is desired.

It is an object of the present invention to provide a technique capable of preventing a chalcogenide material layer on an interlayer dielectric film from exfoliating from the interlayer dielectric film without providing an adhesive layer on the lower surface of the chalcogenide material layer.

The above and other objects and novel characteristics of the present invention will be apparent from the description of this specification and the accompanying drawings.

The effects obtained by typical aspects of the present invention will be briefly described below.

The present invention is a method of manufacturing a semiconductor device comprising: an interlayer dielectric film formed on a main surface of a semiconductor substrate; a chalcogenide material layer provided so as to extend on the interlayer dielectric film; and a top electrode provided on the chalcogenide material layer, where the interlayer dielectric film is formed containing at least silicon, oxygen, and fluorine.

Further, it is a method of manufacturing a semiconductor device comprising: an interlayer dielectric film formed on a main surface of a semiconductor substrate; a chalcogenide material layer provided so as to extend on the interlayer dielectric film; and a top electrode provided on the chalcogenide material layer, where at least fluorine is adsorbed onto the interlayer dielectric film and the plug.

Moreover, the present invention is a semiconductor device comprising: an interlayer dielectric film formed on a main surface of a semiconductor substrate; a chalcogenide material layer provided so as to extend on the interlayer dielectric film; and a top electrode provided on the chalcogenide material layer, where a fluorine concentration in an interface between the interlayer dielectric film and the chalcogenide material layer is higher than a fluorine concentration in an interface between the chalcogenide material layer and the top electrode.

The effects obtained by typical aspects of the present invention will be briefly described below.

According to the present invention, exfoliation from the interlayer dielectric film can be prevented.

BRIEF DESCRIPTIONS OF THE DRAWINGS

BEST MODE FOR CARRYING OUT THE INVENTION

Hereinafter, embodiments of the present invention will be described in detail with reference to the accompanying drawings. Note that, components having the same function are denoted by the same reference symbols throughout the drawings for describing the embodiment, and the repetitive description thereof will be omitted.

First Embodiment

Figure 1:
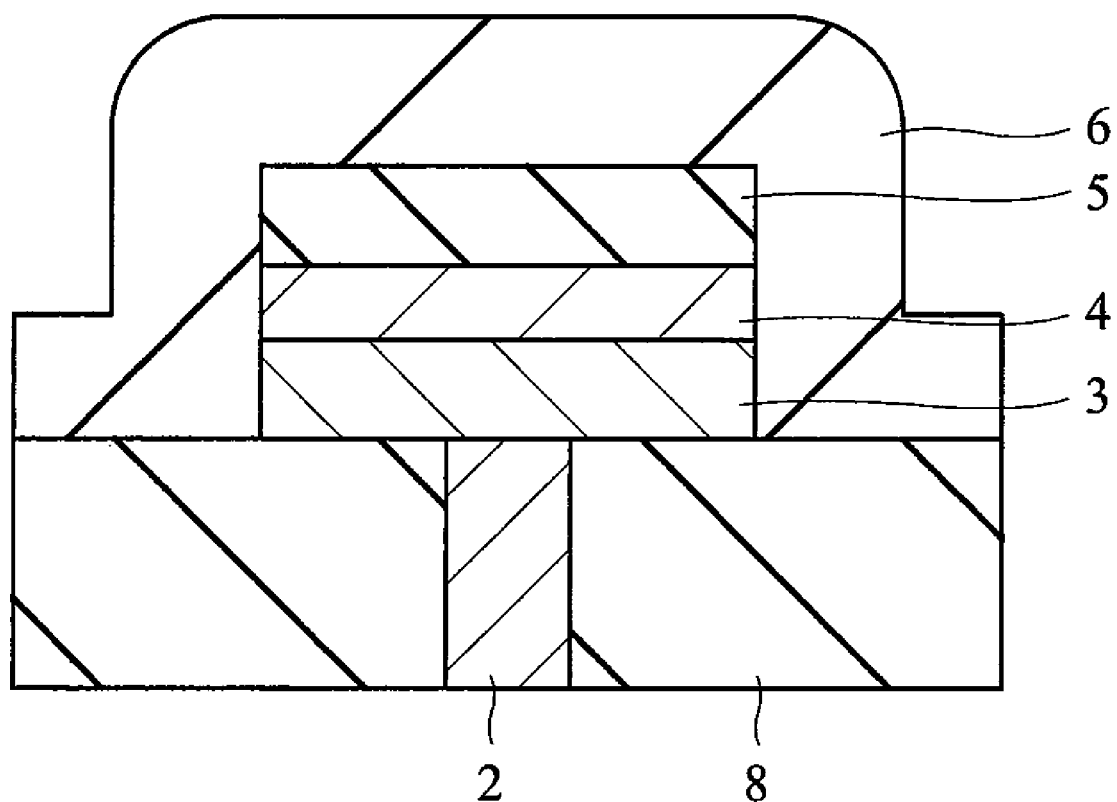
FIG. 1 is a cross sectional view of main parts schematically showing a phase-change memory cell according to the present invention.
Figure 2:
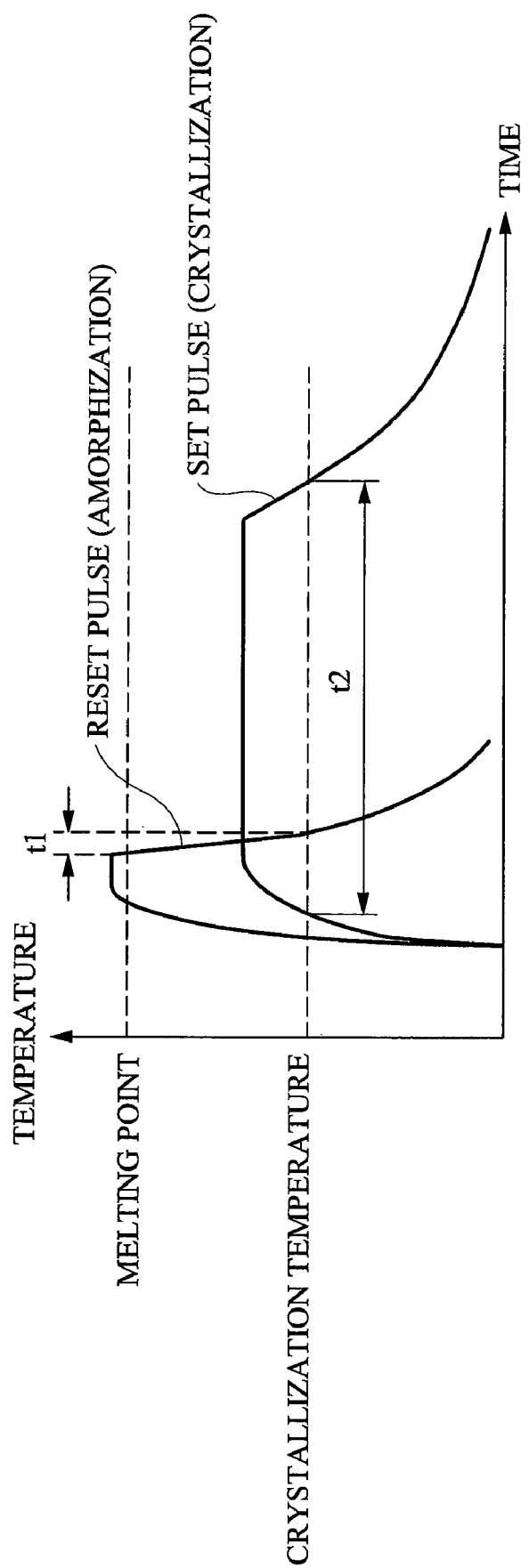
FIG. 2 is an explanatory diagram showing current pulse specifications for changing phase states of chalcogenide.

First, a phase-change memory cell according to the present invention will be described with reference to FIG. 1 and FIG. 2. FIG. 1 is a cross sectional view of main parts schematically showing the phase-change memory cell according to the present invention. FIG. 2 is an explanatory diagram showing current pulse specifications for changing phase states of a chalcogenide.

The phase-change memory of FIG. 1 comprises: an interlayer dielectric film 8 provided above a select transistor (not illustrated) formed on a main surface of a semiconductor substrate; a plug 2 selectively provided penetrating through the interlayer dielectric film 8 and having an end electrically connected to the select transistor; a chalcogenide material layer 3 electrically connected to the other end of the plug 2 and provided so as to extend on the interlayer dielectric film 8; and a top electrode 4 provided on the chalcogenide material layer 3. Note that, although it will be described later, a fluorine concentration in an interface between the interlayer dielectric film 8 and the chalcogenide material layer 3 is higher than a fluorine concentration in an interface between the chalcogenide material layer 3 and the top electrode 4.

A feature of such a phase-change memory resides in that a read signal is large since the resistance value of the chalcogenide material is changed by 2 to 3 digits in accordance with the crystalline state and the resistance value is used as the signal. As a result, sensing operation is facilitated, and the speed of reading is increased. In addition to this, it has a performance that compensates for the drawback of FLASH memory, for example, rewrite can be performed for $10^{12}$ times. Moreover, features such as that operation can be performed with a low voltage and low power and that mixed embedding with a logic circuit is easy are suitable for mobile devices.

Here, operation principles of the phase-change memory will be described with FIG. 2. When the chalcogenide material is to be amorphized, a reset pulse that heats the temperature of the chalcogenide material to a melting point or above and then cools it rapidly is applied. The melting point is, for example, about 600° C. The time for rapid cooling (t1) is, for example, about 2 nsec. When the chalcogenide material is to be crystallized, a set pulse that keeps the temperature of the chalcogenide material to a temperature that is higher than or equal to a crystallization temperature and lower than or equal to the melting point is applied. The crystallization temperature is, for example, about 400° C. The time required for crystallization (t2) is, for example, about 50 nsec.

Figure 10:
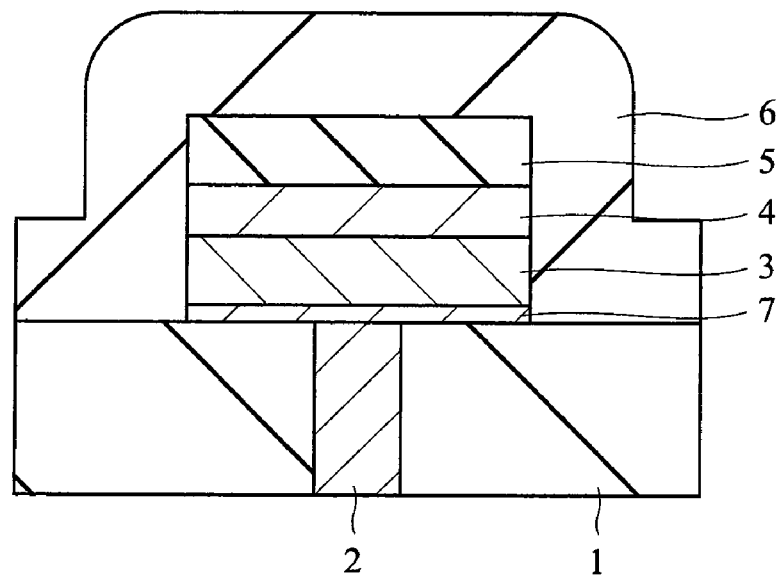
FIG. 10 is a cross sectional view of main parts schematically showing a second example of the semiconductor devices studied by the inventor of the present invention.
Figure 11:
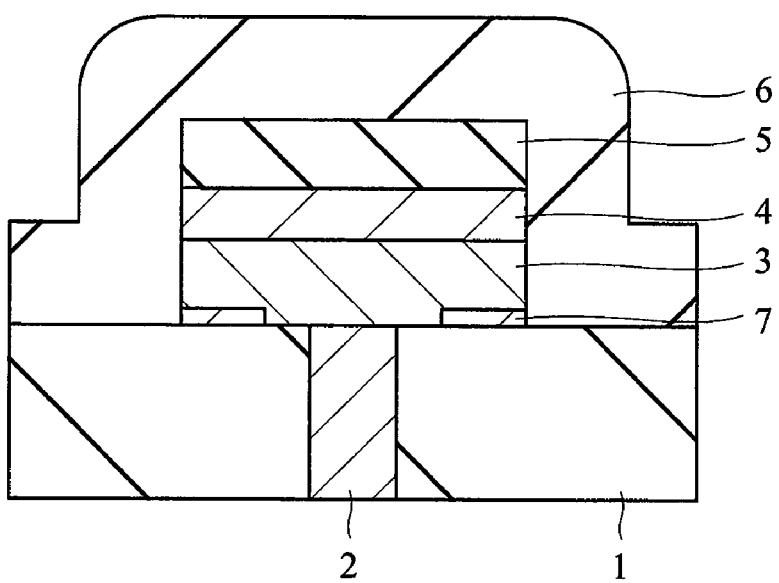
FIG. 11 is a cross sectional view of main parts schematically showing a third example of the semiconductor devices studied by the inventor of the present invention.

The phase change memory according to the present invention shown in FIG. 1 is not provided with the adhesive layer 7 which comprises a conductive material such as Ti or Al as shown in above-described FIG. 10 and FIG. 11. The above-described adhesive layer 7 is provided to enhance the bonding force of the interface because the conductive material is readily reacted with the chalcogenide material so that the exfoliation resistance of the chalcogenide material layer 3 is improved. However, as mentioned above, there arise the problems that, for example, a large current is required for carrying out phase change and that an additional step is required.

Accordingly, in the phase-change memory according to the present first embodiment, the adhesive layer comprising a conductive material is not provided, and the interlayer dielectric film 8 is caused to contain fluorine to improve the exfoliation resistance of the chalcogenide material layer so as to chemically bond the fluorine and the chalcogenide material to each other, thereby increasing the adhesion force between the interlayer dielectric film 8 and the chalcogenide material layer 3. Therefore, other than the conductive material, exfoliation of the chalcogenide material layer can be prevented also by using an insulating material containing fluorine. This is for the reason that fluorine chemically reacts with both the insulating material and chalcogenide material to increase the bonding force.

As described above, in the phase-change memory cell according to the present invention, since the interlayer dielectric film 8 contains fluorine, the fluorine concentration in the interface between the interlayer dielectric film 8 and the chalcogenide material layer 3 is higher than the fluorine concentration in the interface between the chalcogenide material layer 3 and the top electrode 4.

Here, an example of a manufacturing process will be described with reference to FIG. 1. First, the select transistor is formed on the semiconductor substrate not shown by a known manufacturing method. Then, the interlayer dielectric film 8 formed of, for example, a silicon oxide film containing fluorine (e.g., SiOF film) is deposited, and the plug 2 formed of, for example, tungsten is formed in the interlayer dielectric film 8. Then, the chalcogenide material layer 3 formed of, for example, GeSbTe, the top electrode 4 formed of, for example, tungsten, and the hard mask 5 formed of, for example, a silicon oxide film are sequentially deposited. Then, the hard mask 5, the top electrode 4, and the chalcogenide material layer 3 are processed by a known lithography method and dry etching method. Finally, by depositing the interlayer dielectric film 6, the state as shown in FIG. 1 is achieved.

As described above, the above-described interlayer dielectric film 1 of FIG. 10 and FIG. 11 comprises, for example, a so-called P-TEOS film formed by a plasma CVD method using tetraethoxysilane ($Si(OC_2H_5)_4$: TEOS) and oxygen as its raw materials. In the first embodiment, in formation of the interlayer dielectric film 8 containing fluorine, one of gas materials containing fluorine is fed during formation of the P-TEOS film. The gas containing fluorine is a gas comprising at least one or more kinds of gases selected from, for example, $F_2$, $CF_4$, $C_2F_6$, $CHF_3$, $CH_2F_2$, $C_3F_8$, $C_4F_8$, $SF_6$, $SiF_4$, and $NF_3$. Consequently, the interlayer dielectric film 8 that is excellent in the adhesiveness to the chalcogenide material layer and contains at least silicon, oxygen, and fluorine can be formed.

Here, regarding the concentration of fluorine in the interlayer dielectric film 8 of the first embodiment, the concentration of fluorine in the interface with the chalcogenide material layer 3 is required to be 0.1 at. % or more with respect to silicon. In addition, since only the vicinity of the interface with the chalcogenide material layer 3 contributes to prevent exfoliation of the chalcogenide material layer 3, the fluorine concentration in the upper surface of the interlayer dielectric film 8 is desired to be higher than the fluorine concentration in the lower surface. Note that, as the element contained in the interlayer dielectric film 8, chlorine, bromine, or iodine of halogen family can also obtain similar effects other than fluorine.

Note that, as a result of the prior art document research made by the inventor of the present invention, in Japanese Patent Application Laid-Open Publication No. 2004-288843 (Patent Document 4), SiOF is mentioned as an example of an insulating film material formed under a chalcogenide material layer; however, the adhesiveness with the chalcogenide material layer is not clearly mentioned. Therefore, in the above-mentioned Patent Document 4, insulating materials such as $SiO_2$ and $Si_3N_4$ having bad adhesiveness with the chalcogenide material are also mentioned as examples of the insulating film material formed under the chalcogenide material layer. Thus, it is different from the present invention where the fact has been found out that, when the interlayer dielectric film containing fluorine is used, exfoliation of the chalcogenide material layer can be prevented without using an adhesive layer because the fluorine and chalcogenide material are chemically bonded to each other to increase the adhesion force.

According to this means of the first embodiment, since the interlayer dielectric film 8 containing fluorine is formed on the lower surface of the chalcogenide material layer 3, the adhesion force of the chalcogenide material layer 3 is enhanced, and exfoliation during the manufacturing process can be prevented. In addition, since an adhesive layer is not required to be newly added, exfoliation of the chalcogenide material layer 3 can be prevented without exerting adverse effects on the rewrite property of the phase-change memory.

Figure 3:
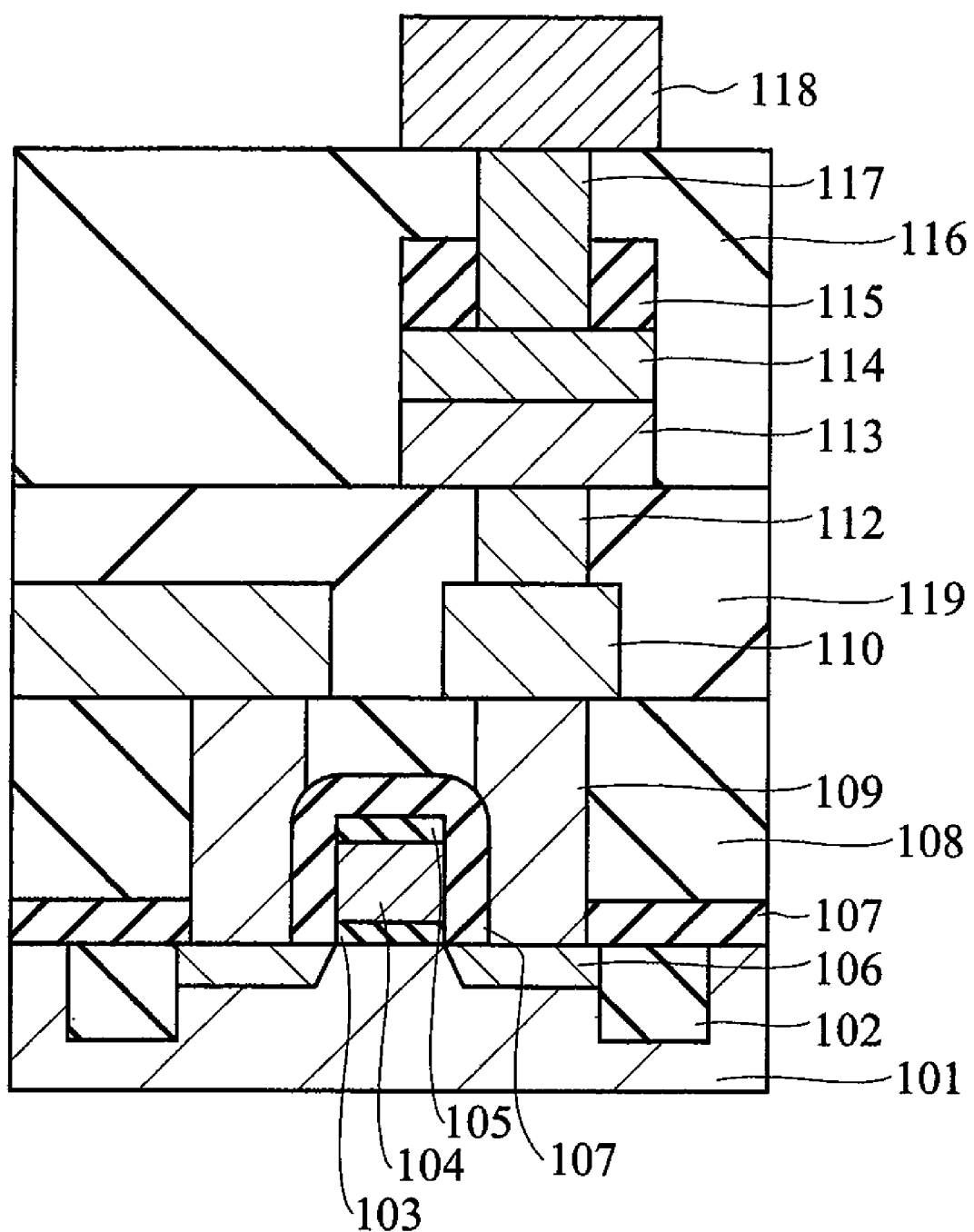
FIG. 3 is a cross sectional view of main parts schematically showing a semiconductor device according to a first embodiment.
Figure 4:
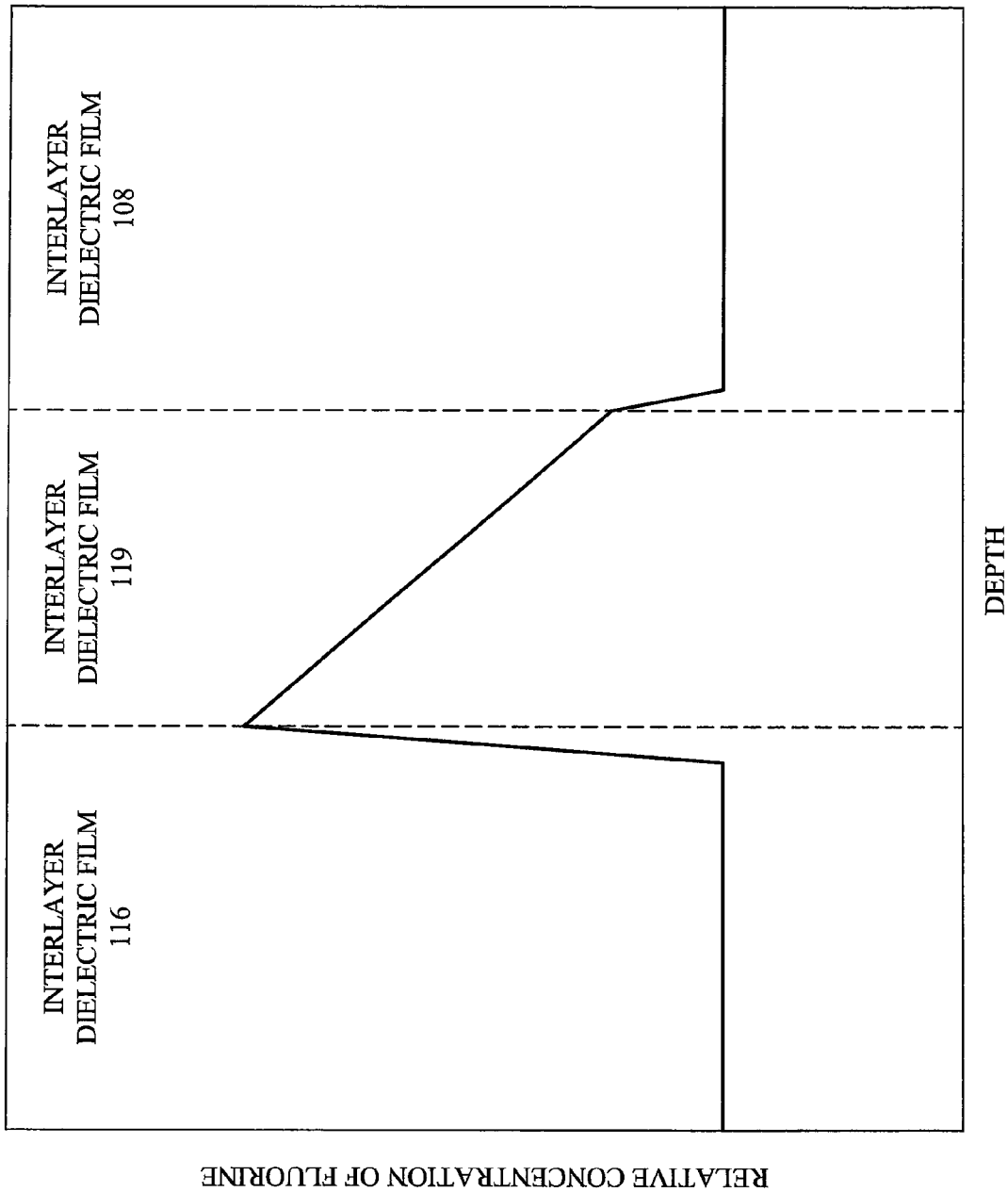
FIG. 4 is an explanatory diagram showing a fluorine concentration distribution in interlayer dielectric films of FIG. 3.

Next, a semiconductor device using a phase-change memory cell according to the present invention will be described with reference to FIG. 3 and FIG. 4. FIG. 3 is a cross sectional view of main parts schematically showing the semiconductor device according to the first embodiment. FIG. 4 is an explanatory diagram showing a fluorine concentration distribution in interlayer dielectric films of FIG. 3.

The semiconductor device of FIG. 3 is an example specifically showing a means of forming the interlayer dielectric film containing fluorine under a chalcogenide material layer as described above. An example of a manufacturing process of the semiconductor device according to the first embodiment will be described with FIG. 3.

First, after a semiconductor substrate 101 is prepared, an isolation oxide film 102 for isolating a MOS transistor, which is used as the select transistor, is formed on a surface of the semiconductor substrate 101 by a known selective oxidation method or shallow trench isolation method. In the first embodiment, to form the isolation oxide film 102, for example, the shallow trench isolation method capable of planarizing the surface is used. Specifically, isolation trenches are formed in the semiconductor substrate 101 by using a known dry etching method and damages caused by dry etching on the sidewalls and bottom surfaces of the trenches are removed, and an oxide film is then deposited by using a known CVD method and the oxide film that is present in the part other than the trenches is selectively polished also by a known CMP method, so that only the isolation oxide film 102 embedded in the trenches is left.

Subsequently, the MOS transistor used as the select transistor is formed on a main surface of the semiconductor substrate 101. Next, although it is not shown, wells of two mutually different conduction types are formed by high-energy impurity implantation. Next, after the surface of the semiconductor substrate 101 is cleaned, a gate oxide film 103 of the MOS transistor is formed by a known thermal oxidation method.

Subsequently, on a surface of the gate oxide film 103, a gate electrode 104 formed of polycrystalline silicon and a silicon nitride film 105 are deposited. Then, after the gate is processed by a lithography step and a dry etching step, an impurity is subjected to implantation by using a resist and the gate electrode 104 as a mask, thereby forming a diffusion layer 106. In the first embodiment, a polycrystalline polysilicon gate is used as the gate electrode 104; however, as a low-resistance gate, a polymetal gate having a laminated structure of metal/barrier metal/polycrystalline silicon can be also used.

Subsequently, a silicon nitride film 107 is deposited by a CVD method for self align contact application. Then, an interlayer dielectric film 108 comprising a silicon oxide film is deposited on the entire surface, and it is subjected to planarization of surface unevenness caused by the gate electrode 104 by using a known CMP method.

Subsequently, by a lithography step and a dry etching step, plug contact holes are opened in the interlayer dielectric film 108. In this process, to avoid exposure of the gate electrode 104, the interlayer dielectric film 108 is processed under the conditions of so-called self alignment, in other words, under the conditions that the silicon oxide film is highly selected with respect to the silicon nitride film.

Note that the steps below can be also used as a measure for misalignment of the plug contact holes with respect to the diffusion layer 106. Specifically, there is also a step usable in which, the interlayer dielectric film 108 is subjected to dry etching under the conditions that the silicon oxide film is highly selected with respect to the silicon nitride film so that the silicon nitride film on the upper surface of the diffusion layer 106 is left, and then dry etching is carried out under the conditions that the silicon nitride film is highly selected with respect to the silicon oxide film so that the silicon nitride film on the upper surface of the diffusion layer 106 is removed.

Subsequently, tungsten is buried in the plug contact holes, and tungsten plugs 109 are formed by a known CMP method. Next, tungsten having a film thickness of, for example, about 100 nm is deposited by a sputtering method, and the tungsten is processed by a lithography step and a dry etching step, thereby forming a first wiring layer 110.

Subsequently, an interlayer dielectric film 119 comprising a silicon oxide film (for example, SiOF film) containing fluorine is deposited by using a plasma CVD method using TEOS, $O_2$, and $F_2$ as raw materials and subjected to planarization of surface unevenness caused by the first wiring layer by using a known CMP method. In the first embodiment, the silicon oxide film containing fluorine is formed as the interlayer dielectric film 119 containing fluorine by using the plasma CVD method using TEOS, $O_2$, and $F_2$ as raw materials; however, the film is not limited thereto, and an interlayer dielectric film having a silicon oxide film as a base material can be formed by a chemical vapor deposition method using, for example, $CF_4$, $C_2F_6$, $CHF_3$, $CH_2F_2$, $C_3F_8$, $C_4F_8$, $SF_6$, $SiF_4$, and $NF_3$ as one of raw materials.

Subsequently, a plug contact hole is opened in the interlayer dielectric film 119 by a lithography step and a dry etching step. Then, tungsten is buried in the plug contact hole, and a tungsten plug 112 is formed by a known CMP method.

Subsequently, a chalcogenide material layer 113 comprising GeSbTe having a film thickness of, for example, about 100 nm and a top electrode 114 formed of tungsten having a film thickness of, for example, about 50 nm are sequentially deposited by a known sputtering method. In the first embodiment, GeSbTe is used as the chalcogenide material layer 3; however, the material is not limited to this, and a chalcogenide material containing at least two or more elements selected from Ge, Sb, and Te can be used. Also, a chalcogenide material containing at least two or more elements selected from Ge, Sb, and Te and at least one element selected from the group 1b, the group 2b, and the groups 3a to 7a of the periodic table may be used.

Subsequently, a silicon oxide film 115 is deposited by a known CVD method. Then, the silicon oxide film 115, the top electrode 114, and the chalcogenide material layer 113 are sequentially processed by a known lithography step and dry etching step.

Subsequently, an interlayer dielectric film 116 comprising a silicon oxide film is deposited on the entire surface and subjected to planarization of surface unevenness by using a known CMP method. Then, a plug contact hole is opened in the interlayer dielectric film 116 and the silicon oxide film 115 by a lithography step and a dry etching step. Then, tungsten is buried in the plug contact hole, and a tungsten plug 117 is formed by a known CMP method.

Subsequently, aluminum having a film thickness of 200 nm is deposited, and it is processed as a wiring layer so as to form a second wiring layer 118. As a matter of course, copper having low resistance can be used instead of aluminum. The semiconductor device having the phase-change memory cell of the first embodiment shown in FIG. 3 is substantially completed by the above-described steps.

According to the first embodiment, since the interlayer dielectric film containing fluorine is formed on the lower surface of the chalcogenide material layer, the adhesion force of the chalcogenide material layer is increased, thereby increasing exfoliation during manufacturing steps.

A desired fluorine concentration distribution in respective interlayer dielectric films in the semiconductor device according to the first embodiment is shown in FIG. 4. This fluorine concentration distribution is corresponding to a result of carrying out an elemental analysis in the depth direction in the order of the interlayer dielectric films 116, 119, and 108 of FIG. 3. The horizontal axis represents the depth in the film thickness direction, and the vertical axis represents the relative concentration of fluorine.

As shown in FIG. 4, only the interlayer dielectric film 119 positioned under the chalcogenide material layer is required to form the interlayer dielectric film containing fluorine; therefore, the fluorine concentration thereof is relatively high compared with the interlayer dielectric films 116 and 108. Fluorine may be added to the interlayer dielectric film 116 and the interlayer dielectric film 108; however, since mechanical strength is reduced when the fluorine concentration in the silicon oxide film is high, it is desired that fluorine is not intentionally added to the interlayer dielectric films that do not contribute to adhesion force improvement of the chalcogenide material layer. For the reason similar to this, also about the interlayer dielectric film 119, the fluorine concentration in the upper surface of the interlayer dielectric film 119 is desired to be higher than the fluorine concentration in the lower surface because the part except for the vicinity of the interface with the chalcogenide material layer does not contribute to adhesion improvement. For example, when the gas containing fluorine is fed as one of raw materials during formation of the interlayer dielectric film, the gas flow rate can be increased in a film formation latter stage compared with that in a film formation initial stage. As a result, the fluorine concentration distribution in the interlayer dielectric film 119 has the state as shown in FIG. 4.

In this manner, in the semiconductor device according to the first embodiment, the chalcogenide material layer 113 on the interlayer dielectric film 119 can be prevented from exfoliating from the interlayer dielectric film 119 without providing an adhesive layer on the lower surface of the chalcogenide material layer 113.

Second Embodiment

In the above-described first embodiment, the case in which the interlayer dielectric film containing fluorine is formed below the chalcogenide material layer has been described; however, in a present second embodiment, the case in which fluorine is added to the interface between the chalcogenide material layer and the interlayer dielectric film will be described.

As described above, in the phase-change memory according to the present invention shown in FIG. 1, the adhesive layer 7 formed of a conductive material such as Ti or Al is not provided like shown in above-described FIG. 10 and FIG. 11. The above-described adhesive layer 7 is provided since the conductive materials are readily reacted with the chalcogenide material, the bonding force of the interface is enhanced, and the exfoliation resistance of the chalcogenide material layer 3 is improved. However, as described above, the problems such that a large current is required for phase change and that the additional step is required are generated.

Accordingly, in a phase change memory according to the second embodiment, instead of providing the adhesive layer formed of a conductive material, fluorine is added to the interface between the chalcogenide material layer 3 and the interlayer dielectric film 8 so as to improve the exfoliation resistance of the chalcogenide material layer, thereby causing the fluorine and the chalcogenide material to be chemically bonded to each other to increase the adhesion force between the interlayer dielectric film 8 and the chalcogenide material layer 3. In other words, other than the conductive material, exfoliation of the chalcogenide material layer 3 can be prevented also by adding fluorine to the interface between the chalcogenide material layer 3 and the interlayer dielectric film 8. This is because that fluorine is chemically reacted with both the insulating material and the chalcogenide material and functions to increase the adhesion force.

As described above, in the phase-change memory cell according to the present invention, when fluorine is added to the interface between the chalcogenide material layer 3 and the interlayer dielectric film 8, the fluorine concentration in the interface between the interlayer dielectric film 8 and the chalcogenide material layer 3 becomes higher than the fluorine concentration in the interface between the chalcogenide material layer 3 and the top electrode 4.

Here, an example of a manufacturing process will be described with reference to FIG. 1. First, a select transistor is formed on a semiconductor substrate not shown by a known manufacturing method. Next, by using a known manufacturing method, the interlayer dielectric film 8 comprising, for example, a silicon oxide film is deposited, and the plug 2 formed of, for example, tungsten is formed in the interlayer dielectric film 8. Then, a gas containing fluorine is caused to flow, and fluorine is absorbed onto the interlayer dielectric film 8 and the plug 2. Then, the chalcogenide material layer 3 formed of, for example, GeSbTe, the top electrode 4 formed of, for example, tungsten, and the hard mask 5 comprising, for example, a silicon oxide film are sequentially deposited. Then, the hard mask 5, the top electrode 4, and the chalcogenide material layer 3 are processed by a known lithography method and dry etching method. Then, when the interlayer dielectric film 6 is deposited, the state as shown in FIG. 1 is achieved. Examples of the gas caused to flow for adsorbing the fluorine include $F_2$, $CF_4$, $C_2F_6$, $CHF_3$, $CH_2F_2$, $C_3F_8$, $C_4F_8$, $SF_6$, $SiF_4$, and $NF_3$.

Here, the fluorine concentration in the interface between the chalcogenide material layer 3 and the interlayer dielectric film 8 of the second embodiment is required to be 0.1 at. % or more with respect to silicon. Only the vicinity of the interface with the interlayer dielectric film 8 contributes to exfoliation prevention of the chalcogenide material layer 3; therefore, the fluorine concentration in the interface between the chalcogenide material layer 3 and the interlayer dielectric film 8 is desired to be higher than the fluorine concentration in the interface between the chalcogenide material layer 3 and the top electrode 4. Note that, as the element to be added to the interface between the chalcogenide material layer 3 and the interlayer dielectric film 8, not only fluorine but also chlorine, bromine, or iodine of the halogen family can obtain similar effects.

According to this means of the second embodiment, fluorine is added to the interface between the chalcogenide material layer 3 and the interlayer dielectric film 8; therefore, the adhesion force of the chalcogenide material layer 3 is enhanced, and exfoliation during manufacturing process can be prevented. Moreover, since an adhesive layer is not required to be newly added, exfoliation of the chalcogenide material layer 3 can be prevented without exerting adverse effects on the rewrite property of the phase-change memory.

Figure 5:
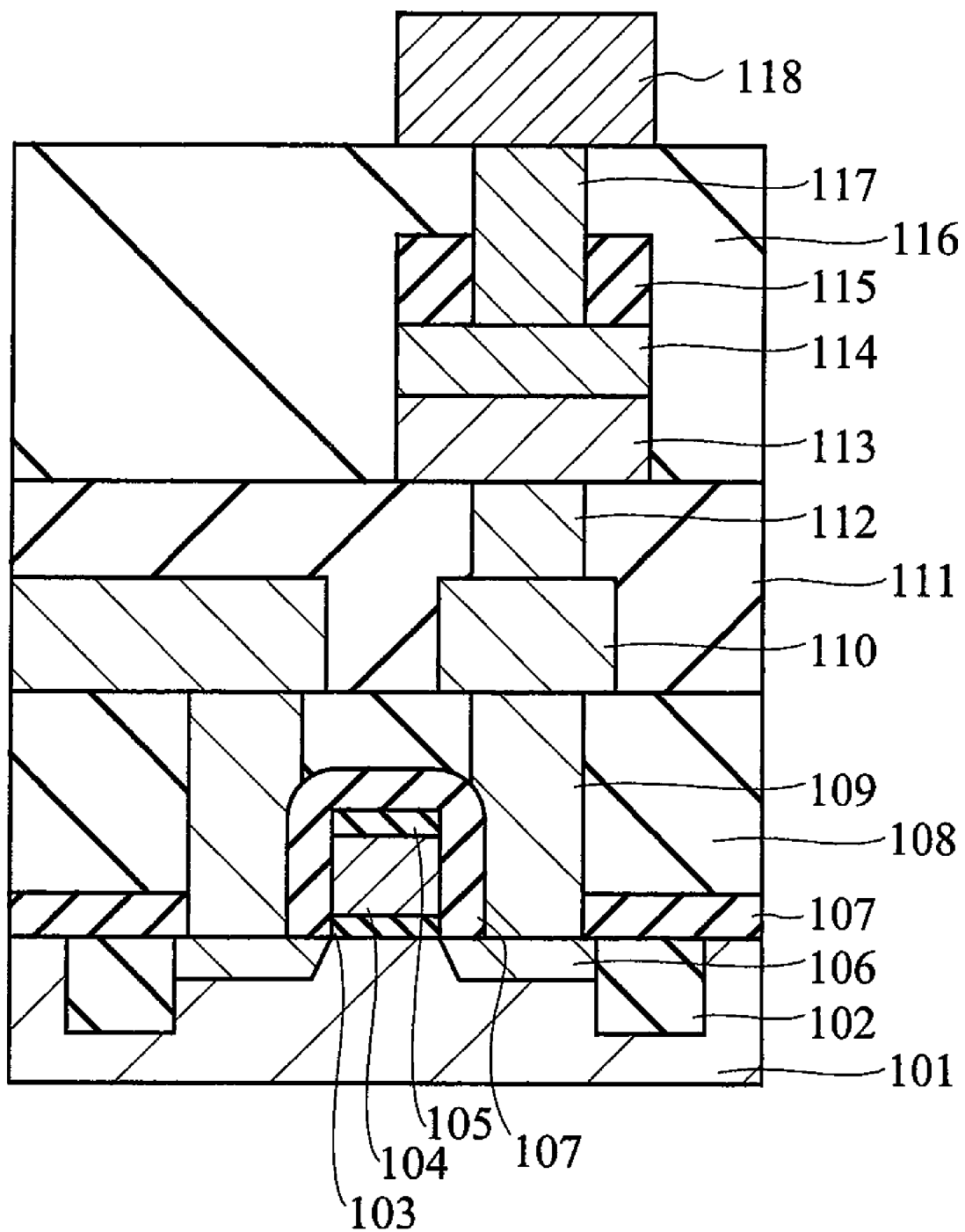
FIG. 5 is a cross sectional view of main parts schematically showing a semiconductor device according to a second embodiment.
Figure 6:
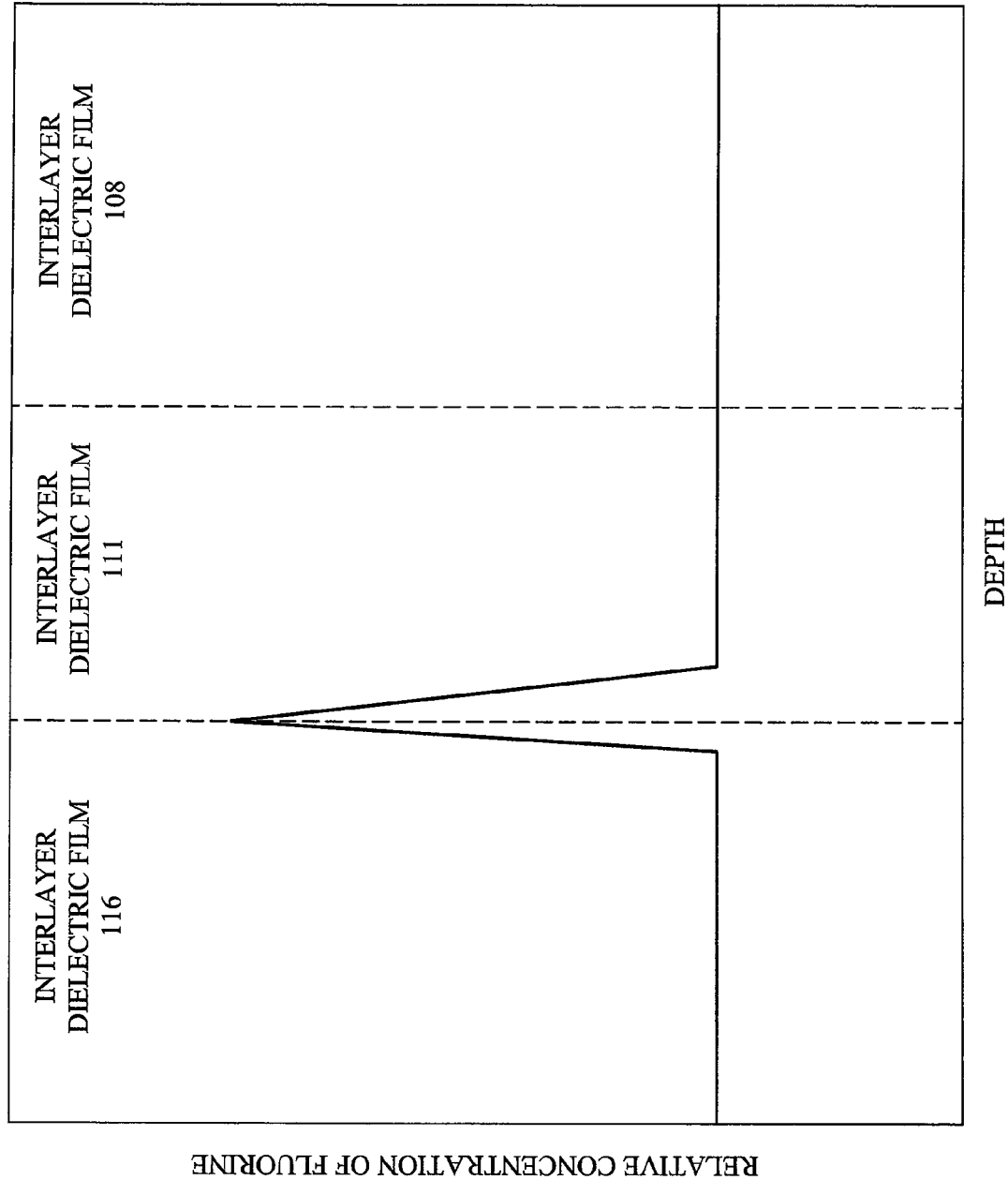
FIG. 6 is an explanatory diagram showing a fluorine concentration distribution in interlayer dielectric films of FIG. 5.
Figure 7:
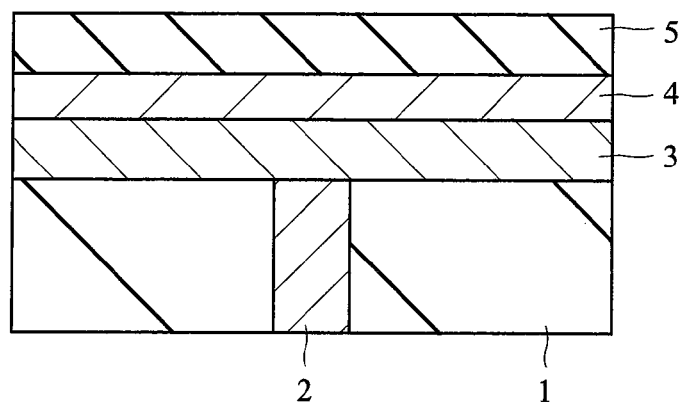
FIG. 7 is a cross sectional view of main parts schematically showing a first example of semiconductor devices in a manufacturing step studied by the inventor of the present invention.
Figure 8:
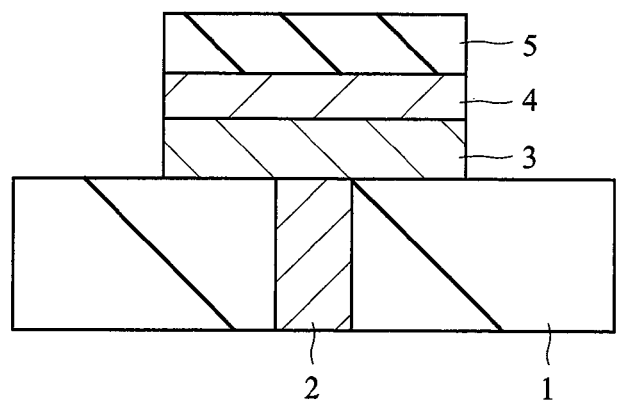
FIG. 8 is a cross sectional view of main parts schematically showing the semiconductor device in a manufacturing step continued from FIG. 7.
Figure 9:
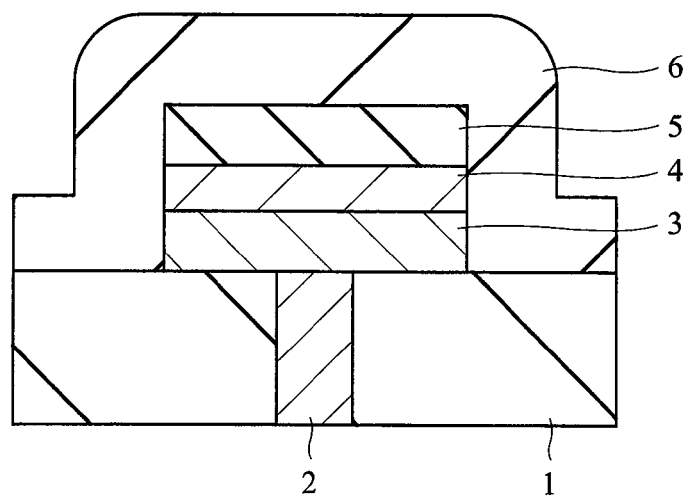
FIG. 9 is a cross sectional view of main parts schematically showing the semiconductor device in a manufacturing step continued from FIG. 8.

Next, a semiconductor device using the phase-change memory according to the present invention will be described with reference to FIG. 5 and FIG. 6. FIG. 5 is a cross sectional view of main parts schematically showing the semiconductor device according to the second embodiment. FIG. 6 is an explanatory diagram showing a fluorine concentration distribution in interlayer dielectric films of FIG. 5.

The semiconductor device of FIG. 5 is an example specifically showing the means of adding fluorine to the interface between the chalcogenide material layer and the interlayer dielectric film as described above. An example of a manufacturing process of the semiconductor device according to the second embodiment will be described with FIG. 5. Note that, the steps are same as those of the above-described first embodiment up to the step of forming the tungsten plug 109; therefore, the description thereof is omitted.

After the tungsten plug 109 is formed, tungsten having a film thickness of, for example, about 100 nm is deposited by a sputtering method on the interlayer dielectric film 108 and the tungsten plug 109, and the tungsten is processed by a lithography step and a dry etching step, thereby forming the first wiring layer 110.

Subsequently, an interlayer dielectric film 111 comprising a silicon oxide film is deposited by using a plasma CVD method using TEOS and $O_2$ as raw materials, and this is subjected to planarization of surface unevenness caused by the first wiring layer by using a known CMP method. Then, after a plug contact hole is opened by a lithography step and a dry etching step, tungsten is buried in the plug contact hole, and the tungsten plug 112 is formed by a known CMP method.

Subsequently, for example, a $F_2$ gas is caused to flow, and fluorine is adsorbed onto the interlayer dielectric film 111 and the tungsten plug 112. Note that, in the second embodiment, $F_2$ is used as the gas for adsorbing fluorine; however, the gas is not limited to this, and, for example, $CF_4$, $C_2F_6$, $CHF_3$, $CH_2F_2$, $C_3F_8$, $C_4F_8$, $SF_6$, $SiF_4$, and $NF_3$ can be used. As a matter of course, if the above-described gas is fed in plasma, adsorption of fluorine to the surface of the interlayer dielectric film 111 becomes more significant; therefore, this is desirable for improving the adhesion force of the chalcogenide material layer 113.

Subsequently, the chalcogenide material layer 113 formed of GeSbTe having a film thickness of, for example, about 100 nm and the top electrode 114 formed of tungsten having a film thickness of, for example, about 50 nm are sequentially deposited by a known sputtering method. Note that, in the second embodiment, GeSbTe is used as the chalcogenide material layer 113; however, the material is not limited to this, and a chalcogenide material containing at least two or more elements selected from Ge, Sb, and Te can be used. Also, a chalcogenide material containing at least two or more elements selected from Ge, Sb, and Te and at least one element selected from the elements of the group 1b, the group 2b, and the groups 3a to 7a of the periodic table may be used.

Subsequently, the silicon oxide film 115 is deposited by a known CVD method. Then, the silicon oxide film 115, the top electrode 114, and the chalcogenide material layer 113 are sequentially processed by a known lithography step and dry etching step.

The steps thereafter are same as those of the first embodiment; therefore, the descriptions thereof will be omitted. The phase-change memory cell of the present embodiment shown in FIG. 5 is substantially completed by the above steps.

In the semiconductor device according to the second embodiment, fluorine is added to the interface between the chalcogenide material layer 113 and the interlayer dielectric film 111; thus, the adhesion force of the chalcogenide material layer 113 is enhanced. Therefore, the chalcogenide material layer 113 on the interlayer dielectric film 111 can be prevented from exfoliating from the interlayer dielectric film 111 without providing an adhesive layer on the lower surface of the chalcogenide material layer 113.

A desired fluorine concentration distribution in the interlayer dielectric films in the semiconductor device according to the second embodiment is shown in FIG. 6. This fluorine concentration distribution corresponds to a result of carrying out elemental analysis in the depth direction in the order of the interlayer dielectric films 116, 111, and 108 of FIG. 5. The horizontal axis represents the depth in the film thickness direction, and the vertical axis represents the relative concentration of fluorine.

As shown in FIG. 6, since fluorine is added to the interface between the chalcogenide material layer 113 and the interlayer dielectric film 111, the fluorine concentration of the interface between the interlayer dielectric film 116 and the interlayer dielectric film 111 is high. Fluorine may be added into the films of the interlayer dielectric film 116, the interlayer dielectric film 111, and the interlayer dielectric film 108; however, since the mechanical strength is reduced when the fluorine concentration in the silicon oxide film is increased, it is desired that fluorine is not intentionally added to the regions that do not contribute to adhesion force improvement of the chalcogenide material layer.

As described above, in the semiconductor device according to the second embodiment, the chalcogenide material layer 113 on the interlayer dielectric film 111 can be prevented from exfoliating from the interlayer dielectric film 111 without providing an adhesive layer on the lower surface of the chalcogenide material layer 113.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the above-described embodiments, the case in which the chalcogenide material formed of GeSbTe is applied to the chalcogenide material layer has been described; however, they are also applicable to a chalcogenide material containing Ge which is readily chemically reacted with fluorine.

According to the invention disclosed in the present specification, exfoliation from the interlayer dielectric film can be prevented. Consequently, ununiformity of electric characteristics and deterioration of reliability caused by the manufacturing process of the phase-change memory can be suppressed, and furthermore, the current for rewrite can be reduced to a level at which a MOS transistor can be operated by enhancing the efficiency of heat generation.

INDUSTRIAL APPLICABILITY

The present invention can be widely utilized in the manufacturing industry of manufacturing a semiconductor device having a phase-change memory cell formed of a chalcogenide material.

The invention claimed is:

1. A semiconductor device comprising:
a semiconductor substrate;
a select transistor formed on a main surface of the semiconductor substrate;
an interlayer dielectric film provided above the select transistor;
a plug selectively provided so as to penetrate through the interlayer dielectric film and having an end electrically connected to the select transistor;
a chalcogenide material layer electrically connected to the other end of the plug and provided so as to extend on the interlayer dielectric film; and
a top electrode provided on the chalcogenide material layer, wherein
the interlayer dielectric film contains fluorine,
a fluorine concentration in an interface between the interlayer dielectric film and the chalcogenide material layer is higher than a fluorine concentration in an interface between the chalcogenide material layer and the top electrode,
a fluorine concentration at an upper portion of the interlayer dielectric film is higher than a fluorine concentration at a lower portion of the interlayer dielectric film, and
the fluorine concentration at the upper portion of the interlayer dielectric film is the highest fluorine concentration in the interlayer dielectric film,
wherein a fluorine concentration inside the interlayer dielectric film is gradually lowered from the upper portion of the interlayer dielectric film to the lower portion of the interlayer dielectric film.

2. The semiconductor device according to claim 1, wherein the interlayer dielectric film comprises a material containing at least silicon, oxygen, and fluorine.

3. The semiconductor device according to claim 1, wherein a fluorine concentration in an upper surface of the interlayer dielectric film is higher than a fluorine concentration in a lower surface of the interlayer dielectric film.

4. The semiconductor device according to claim 1, wherein the chalcogenide material layer is in direct contact with the interlayer dielectric film.

5. The semiconductor device according to claim 1, wherein the chalcogenide material layer is in direct contact with the plug.

6. The semiconductor device according to claim 1, further comprising:
an upper dielectric film deposited on an upper surface of the interlayer dielectric film;
wherein the chalcogenide material layer and the top electrode are disposed in the upper dielectric film; and
wherein the upper dielectric film has a fluorine concentration which decreases from a first level at the interface between the interlayer dielectric film and the chalcogenide material layer to a second level at the interface between the chalcogenide material layer and the top electrode.

7. The semiconductor device according to claim 1, further comprising:
an upper dielectric film deposited on an upper surface of the interlayer dielectric film;
wherein the chalcogenide material layer and the top electrode are disposed in the upper dielectric film; and
wherein the upper dielectric film has a fluorine concentration which decreases gradually from a first level at the interface between the interlayer dielectric film and the chalcogenide material layer to a second level at the interface between the chalcogenide material layer and the top electrode.

8. A semiconductor device comprising:
a semiconductor substrate;
a select transistor formed on a main surface of the semiconductor substrate;
an interlayer dielectric film provided above the select transistor;
a plug selectively provided so as to penetrate through the interlayer dielectric film and having an end electrically connected to the select transistor;
a chalcogenide material layer electrically connected to the other end of the plug and provided so as to extend on the interlayer dielectric film;
a top electrode provided on the chalcogenide material layer; and
an upper dielectric film deposited on an upper surface of the interlayer dielectric film;
wherein the interlayer dielectric film contains fluorine,
wherein a fluorine concentration in an interface between the interlayer dielectric film and the chalcogenide material layer is higher than a fluorine concentration in an interface between the chalcogenide material layer and the top electrode,
wherein a fluorine concentration at an upper portion of the interlayer dielectric film is higher than a fluorine concentration at a lower portion of the interlayer dielectric film, wherein the fluorine concentration at the upper portion of the interlayer dielectric film is the highest fluorine concentration in the interlayer dielectric film, wherein the chalcogenide material layer and the top electrode are disposed in the upper dielectric film; and wherein the upper dielectric film has a fluorine concentration which decreases from a first level at the interface between the interlayer dielectric film and the chalcogenide material layer to a second level at the interface between the chalcogenide material layer and the top electrode.

9. The semiconductor device according to claim 8, wherein the interlayer dielectric film comprises a material containing at least silicon, oxygen, and fluorine.

10. The semiconductor device according to claim 8, wherein a fluorine concentration in an upper surface of the interlayer dielectric film is higher than a fluorine concentration in a lower surface of the interlayer dielectric film.

11. The semiconductor device according to claim 8, wherein the chalcogenide material layer is in direct contact with the interlayer dielectric film.

12. The semiconductor device according to claim 8, wherein the chalcogenide material layer is in direct contact with the plug.

13. A semiconductor device comprising:
a semiconductor substrate;
a select transistor formed on a main surface of the semiconductor substrate;
an interlayer dielectric film provided above the select transistor;
a plug selectively provided so as to penetrate through the interlayer dielectric film and having an end electrically connected to the select transistor;
a chalcogenide material layer electrically connected to the other end of the plug and provided so as to extend on the interlayer dielectric film;
a top electrode provided on the chalcogenide material layer; and
an upper dielectric film deposited on an upper surface of the interlayer dielectric film;

wherein the interlayer dielectric film contains fluorine, wherein a fluorine concentration in an interface between the interlayer dielectric film and the chalcogenide material layer is higher than a fluorine concentration in an interface between the chalcogenide material layer and the top electrode, wherein a fluorine concentration at an upper portion of the interlayer dielectric film is higher than a fluorine concentration at a lower portion of the interlayer dielectric film, wherein the fluorine concentration at the upper portion of the interlayer dielectric film is the highest fluorine concentration in the interlayer dielectric film, wherein the chalcogenide material layer and the top electrode are disposed in the upper dielectric film; and wherein the upper dielectric film has a fluorine concentration which decreases gradually from a first level at the interface between the interlayer dielectric film and the chalcogenide material layer to a second level at the interface between the chalcogenide material layer and the top electrode.

14. The semiconductor device according to claim 13, wherein the interlayer dielectric film comprises a material containing at least silicon, oxygen, and fluorine.

15. The semiconductor device according to claim 13, wherein a fluorine concentration in an upper surface of the interlayer dielectric film is higher than a fluorine concentration in a lower surface of the interlayer dielectric film.

16. The semiconductor device according to claim 13, wherein the chalcogenide material layer is in direct contact with the interlayer dielectric film.

17. The semiconductor device according to claim 13, wherein the chalcogenide material layer is in direct contact with the plug.

* * * * *